US012693594B2

(12) United States Patent
Matejka et al.

(10) Patent No.: US 12,693,594 B2
(45) Date of Patent: Jul. 28, 2026

(54) METHOD AND APPARATUS FOR CHARACTERIZATION OF A MICROLITHOGRAPHY MASK

(71) Applicant: Carl Zeiss SMT GmbH, Oberkochen (DE)

(72) Inventors: Ulrich Matejka, Jena (DE); Sascha Perlitz, Jena (DE); Markus Deguenther, Florstadt (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 321 days.

(21) Appl. No.: 18/385,114

(22) Filed: Oct. 30, 2023

(65) Prior Publication Data

US 2024/0061328 A1 Feb. 22, 2024

Related U.S. Application Data

(63) Continuation of application No. PCT/EP2022/062684, filed on May 10, 2022.

(30) Foreign Application Priority Data

May 27, 2021 (DE) .......................... 102021113780.2

(51) Int. Cl.
G03F 1/84 (2012.01)
G01N 21/88 (2006.01)
(Continued)

(52) U.S. Cl.
CPC ........... G03F 1/84 (2013.01); G01N 21/8806 (2013.01); G01N 21/956 (2013.01);
(Continued)

(58) Field of Classification Search
CPC ......... G03F 1/84; G03F 1/72; G01N 21/8806; G01N 21/956; G01N 2021/8835; G01N 2021/95676
See application file for complete search history.

(56) References Cited

U.S. PATENT DOCUMENTS 6,738,135 B1 * 5/2004 Underwood ......... G01N 21/956
356/237.5
9,904,060 B2 2/2018 Frank et al.
(Continued)

FOREIGN PATENT DOCUMENTS

CN 103843463 6/2014
DE 10 2009 047 180 A1 12/2010
(Continued)

OTHER PUBLICATIONS

International Search Report and Written Opinion of the International Searching Authority for International Application No. PCT/EP2022/062684, dated Oct. 10, 2022.
(Continued)

*Primary Examiner* — Hung V Nguyen
(74) *Attorney, Agent, or Firm* — Fish & Richardson P.C.

(57) ABSTRACT

The invention relates to a method and an apparatus for characterizing a microlithography mask. In one aspect, in a method according to the invention, the mask to be characterized is illuminated with light from a light source via an illumination optics unit, said light having a wavelength of less than 30 nm, wherein light that passes in a used beam path from the light source via the mask to a sensor unit is evaluated, wherein, at least intermittently, a portion of the light emitted by the light source is outcoupled from the used beam path by use of a mirror array having a multitude of independently adjustable mirror elements, and wherein, intermittently by use of the mirror array, all light is out-
(Continued)

coupled from the used beam path for establishment of a defined illumination time of the sensor unit.

18 Claims, 12 Drawing Sheets

(51) Int. Cl.
  *G01N 21/956*     (2006.01)
  *G03F 1/72*      (2012.01)

(52) U.S. Cl.
  CPC ............... *G01N 2021/8835* (2013.01); *G01N 2021/95676* (2013.01); *G03F 1/72* (2013.01)

(56)           References Cited

U.S. PATENT DOCUMENTS

| | | | |
|---|---|---|---|
| 10,025,079 B2 * | 7/2018 | Johnson | ............... G02B 21/008 |
| 10,168,539 B2 | 1/2019 | Frank et al. | |
| 10,578,881 B2 | 3/2020 | Frank et al. | |
| 2005/0270515 A1 | 12/2005 | Troost et al. | |
| 2012/0105989 A1 | 5/2012 | Buis et al. | |
| 2013/0038850 A1 | 2/2013 | Feldmann et al. | |
| 2013/0335552 A1 * | 12/2013 | Feldmann | ................. G03F 1/84 |
| | | | 348/86 |
| 2014/0240686 A1 | 8/2014 | Ruoff et al. | |
| 2015/0001408 A1 | 1/2015 | Frank et al. | |
| 2016/0091422 A1 | 3/2016 | Van Der Zouw | |
| 2018/0173001 A1 | 6/2018 | Frank et al. | |
| 2019/0011839 A1 | 1/2019 | Seitz et al. | |
| 2019/0121145 A1 | 4/2019 | Frank et al. | |
| 2020/0383200 A1 | 12/2020 | Marks et al. | |
| 2021/0397099 A1 | 12/2021 | Ruoff et al. | |

FOREIGN PATENT DOCUMENTS

| | | | | |
|---|---|---|---|---|
| DE | 102010009022 | 8/2011 | | |
| DE | 102010030435 | 12/2011 | | |
| DE | 102010063337 | 6/2012 | | |
| DE | 102011086345 | 5/2013 | | |
| DE | 102012208514 | 11/2013 | | |
| DE | 102012209412 | 12/2013 | | |
| DE | 102013211269 | 4/2014 | | |
| DE | 102013212613 | 12/2014 | | |
| DE | 10 2016 212 266 A1 | 1/2018 | | |
| DE | 10 2017 217 867 A1 | 7/2018 | | |
| DE | 102017115262 | 1/2019 | | |
| DE | 102020207566 | 12/2021 | | |
| JP | 2019-027974 A | 2/2019 | | |
| TW | 200611081 | 4/2006 | | |
| TW | 201107798 | 3/2011 | | |
| TW | 201617743 | 5/2016 | | |
| TW | 201702756 | 1/2017 | | |
| WO | WO 2011/161024 | 12/2011 | | |
| WO | WO 2013/050212 | 4/2013 | | |
| WO | WO 2013/174680 | 11/2013 | | |
| WO | WO-2016008754 A1 * | 1/2016 | ........ | G03F 7/70558 |
| WO | WO 2016/184560 | 11/2016 | | |

OTHER PUBLICATIONS

International Preliminary Report on Patentability for International Application No. PCT/EP2022/062684, dated Dec. 7, 2023.

Office Action issued by the German Patent Office for Application No. DE 10 2021 113 780.2, dated Jan. 18, 2022 (with English Translation).

Office Action and Search Report issued by the Taiwan Patent Office for Application No. TW 111119671, dated Dec. 5, 2022 (with English Translation).

Office Action in Japanese Appln. No. 2023-573235, mailed on Apr. 7, 2026, 5 pages (with English translation).

* cited by examiner

METHOD AND APPARATUS FOR CHARACTERIZATION OF A MICROLITHOGRAPHY MASK

CROSS-REFERENCE TO RELATED APPLICATIONS

This application is a continuation of and claims priority to PCT Patent Application PCT/EP2022/062684 filed on May 10, 2022, which claims priority to German Patent Application DE 10 2021 113 780.2 filed on May 27, 2021. The contents of the above applications are hereby incorporated by reference.

TECHNICAL FIELD

The invention relates to a method and an apparatus for characterizing a microlithography mask.

BACKGROUND

Microlithography is used for production of microstructured components, such as integrated circuits or LCDs, for example. The microlithography process is conducted in what is called a projection illumination apparatus, which comprises an illumination device and a projection lens. The image of a mask (=reticle) illuminated by use of the illumination device is projected here by use of the projection lens onto a substrate (e.g. a silicon wafer) coated with a light-sensitive layer (photoresist) and arranged in the image plane of the projection lens, in order to transfer the mask structure onto the light-sensitive coating of the substrate.

In the lithography process, undesired defects on the mask have a particularly disadvantageous effect since they can be reproduced with every illumination step. A direct analysis of the imaging effect of possible defect positions is thus desirable in order to minimize the mask defects and in order to realize a successful mask repair. In principle, there is therefore a need to analyze or to qualify the mask rapidly and simply, if at all possible under the same conditions as actually exist in the projection illumination apparatus.

In this context, there are different approaches for emulating the projection illumination apparatus within the scope of the mask inspection (i.e., measuring the mask under conditions that are analogous to those in the projection illumination apparatus where possible).

Firstly, the practice of recording and evaluating an aerial image of a section of the mask in a mask inspection apparatus is known, wherein, for the purposes of recording the aerial image, the structures to be measured on the mask are illuminated by a magnifying illumination optics unit and the light coming from the mask is projected on a detector unit via an imaging optical unit and detected by said detector unit.

In this process, it is further known to undertake the illumination of the mask in the mask inspection apparatus in a manner identical to that in the projection illumination apparatus, wherein in particular the same wavelength, the same numerical aperture and also the identical (if appropriate polarized) illumination setting are set in the mask inspection apparatus.

With respect to the prior art, reference is made merely by way of example to DE 10 2010 063 337 B4, DE 10 2013 212 613 A1 and DE 10 2011 086 345 A1.

SUMMARY

It is an aspect of the present invention to provide a method and an apparatus for characterization of a microlithography mask, which enable a fast and reliable characterization taking account of the conditions given in the lithography process.

This aspect is achieved by use of the method and respectively the device in accordance with the features of the independent claims.

In one aspect, the invention relates to a method of characterizing a microlithography mask, wherein the mask to be characterized is illuminated with light from a light source via an illumination optics unit, said light having a wavelength of less than 30 nm;

wherein light that passes in a used beam path from the light source via the mask to a sensor unit is evaluated;

wherein, at least intermittently, a portion of the light emitted by the light source is outcoupled from the used beam path by use of a mirror array having a multitude of independently adjustable mirror elements; and wherein, intermittently by use of the mirror array, all light is outcoupled from the used beam path for establishment of a defined illumination time of the sensor unit.

The outcoupled light may especially be directed to a beam trap.

This configuration takes account of the fact that, on the one hand, the light sources available for generation of EUV light, such as, in particular, a plasma light source for instance, do not enable switch-on and switch-off on the short timescale required in the mask inspection process, but, on the other hand, the sensor arrangement used in the mask inspection process (e.g. CCD camera) requires exactly defined illumination times (typically in the order of magnitude of 200 ms). By virtue of all mirror elements of the mirror array used in accordance with the invention outcoupling the respective incident light from the used beam path (and directing it, for example, into a beam trap provided for the purpose) at the defined endpoint of the respectively defined illumination time, it is possible in accordance with the invention to achieve the same effect as switching off the light source (which is impracticable in the case of the EUV light source), while at the same time dispensing with the use, which is otherwise conceivable for this purpose, of a high-speed shutter.

At the same time, the invention here advantageously makes use of the fact that, as a result of the pulsed operation, the period of time remaining between successive light pulses (of the order of magnitude of typically about 0.2 ms) is available for the respectively required tilting movement of the mirror elements.

In one embodiment, the intensity of a light component outcoupled from the used beam path by the mirror array is detected with an intensity sensor.

The invention takes account, inter alia, of the fact that, in the case of EUV light, outcoupling cannot be effected with a partly transparent mirror as is the case for UV light or for light in the visible wavelength range, since no such thing exists for EUV. According to the abovementioned aspect, the invention includes the concept of outcoupling a portion of the light emitted by the at least one light source and of detecting the intensity or energy of this outcoupled portion. According to the invention, this allows the ascertainment of energy fluctuations on the part of the (at least one) light source such that the images ultimately recorded by the sensor unit can be normalized in relation to the energy of the at least one light source.

In this case, one advantageous consequence of the configuration according to the invention is that a distinction can be made in respect of brightness variations that occur in the images recorded by the sensor unit as to whether such brightness variations are caused by the mask currently being characterized (for example as a result of defects possibly present on this mask) or whether such brightness variations are caused by energy fluctuations of the light source used. In this way, it may be possible to avoid drawing incorrect conclusions about defects perceived to be present on the mask.

In this case, the invention can also make use of the fact that only relative variations or fluctuations over time are of interest in respect of the intensity or energy emitted by the at least one light source; in other words, in particular, there is no need for a spatially resolved quantitative intensity measurement. Moreover, the invention can make use of the fact that only a comparatively small portion of the light emitted by the at least one light source needs to be out-coupled for said ascertainment of relative variations of the energy or intensity over time, and so the predominant portion of light by far is still available for the actual mask characterization.

By way of the aforementioned consideration of energy or intensity variations of the at least one light source, the invention particularly takes account of the circumstances that already minor variations (of the order of significantly less than one percent) are important for the reliable identi-fication of relevant defects in the mask on account of the high demands in terms of accuracy in the microlithography application.

The detecting of the light component outcoupled from the used beam path by the mirror array with an intensity sensor is also advantageous irrespective of the above-described functionality as high-speed shutter.

According to a further aspect, the invention therefore also relates to a method of characterization of a microlithography mask, wherein the mask to be characterized is illuminated with light from a light source via an illumination optics unit, said light having a wavelength of less than 30 nm;

wherein light that passes in a used beam path from the light source via the mask to a sensor unit is evaluated;

wherein, at least intermittently, a portion of the light emitted by the light source is outcoupled from the used beam path by use of a mirror array having a multitude of independently adjustable mirror elements; and wherein, at least intermittently, the intensity of a light component outcoupled from the used beam path by the mirror array is detected with an intensity sensor.

In one embodiment, greyscale adjustment is achieved by actuating at least some of the mirror elements in such a way that they outcouple light from the used beam path only for some of the period of illumination of the sensor unit.

In this configuration, the array according to the invention, composed of independently adjustable mirror elements, is utilized for achievement of greyscale values in that the respective illumination time or the illumination dose is adjusted individually via the individual mirror elements by virtue of the relevant mirror element being "switched off" or tilted in such a way that light incident on this mirror element no longer reaches the sensor unit after the individually definable duration (which is shorter than the overall illumi-nation duration).

This configuration takes account of the fact that, in the inventive operation of a mask inspection system with EUV light, the array according to the invention, composed of independently adjustable mirror elements, cannot be utilized as a blazed grating (for angle-dependent establishment of greyscale values via variation of diffraction efficiency) since, on account of the shorter wavelength by a number of orders of magnitude compared to the dimensions and separations of the mirror elements, it is ultimately necessary to proceed from a geometric optics unit. Proceeding from this consid-eration, greyscale values are achieved in accordance with the invention in spite of this fact, namely in that the respective mirror elements, even after a portion of the respective illumination time (for example after a period of time of 50 ms and hence even after a quarter of the total illumination time of, for example, 200 ms), are tilted into the position suitable for outcoupling of the light from the used beam path.

This aspect of establishing greyscale values is advanta-geous even irrespective of the above-described functionali-ties of the replacement of a high-speed shutter or of the outcoupling to give an intensity sensor.

The invention thus also further relates to a method of characterizing a microlithography mask, wherein the mask to be characterized is illuminated with light from a light source via an illumination optics unit, said light having a wavelength of less than 30 nm;

wherein light that passes in a used beam path from the light source via the mask to a sensor unit is evaluated;

wherein, at least intermittently, a portion of the light emitted by the light source is outcoupled from the used beam path by use of a mirror array having a multitude of independently adjustable mirror elements; and wherein greyscale adjustment is achieved by actuating at least some of the mirror elements in such a way that they outcouple light from the used beam path only for some of the period of illumination of the sensor unit.

In one embodiment, in an intermittent manner, the settings of the mirror elements are chosen such that a first group of mirror elements is in an illumination beam path leading from the light source to the mask, and a second group of mirror elements is in an imaging beam path leading from the mask to the sensor unit.

This configuration takes account of the fact that, in the inventive operation of a mask inspection system with EUV light, on the one hand, for lack of available transmissive materials, there is no available transmissive optical element that serves as beam divider, but, on the other hand, the functionality of such a beam divider is required for separa-tion of the imaging beam path from the illumination beam path, in order, for instance, to achieve mask inspection with vertical incidence of light, which is desirable in particular applications. Proceeding from this consideration, the inven-tion then advantageously makes use of the property of the array used, composed of a multitude of independently adjustable mirror elements, that suitable adjustment of the mirror elements allows the mirror array to contribute partly to the illumination beam path (leading from the light source to the mask) and partly to the imaging beam path (leading from the mask to the sensor arrangement).

In one embodiment, in an intermittent manner, the settings of the mirror elements are chosen such that light hits the mask at an angle based on the mask surface of at least 85°, especially at an angle of 90° (i.e. at right angles to the mask surface).

In one embodiment, the light from the light source has a wavelength of less than 15 nm, especially within the range between 13 nm and 14 nm.

In a further aspect, the invention relates to an apparatus for characterizing a mask for microlithography, comprising a light source for generating light of a wavelength of less than 30 nm;

an illumination optics unit for illuminating the mask to be characterized with light from the light source;

a sensor unit;

an evaluation unit for evaluating the light that passes in a used beam path from the light source via the mask to the sensor unit;

a mirror array composed of a multitude of independently adjustable mirror elements via which at least a portion of the light can be outcoupled from the used beam path; and an actuation unit for actuating the mirror array;

wherein, by use of this actuation for establishment of a defined illumination time of the sensor unit, it is possible to intermittently outcouple all light from the used beam path by use of the mirror array.

In one embodiment, the apparatus has a beam trap for receiving a light component outcoupled from the used beam path by the mirror array.

In one embodiment, the apparatus has an intensity sensor for detecting the intensity of a light component outcoupled from the used beam path by the mirror array.

In a further aspect, the invention relates to an apparatus for characterizing a mask for microlithography, comprising a light source for generating light of a wavelength of less than 30 nm;

an illumination optics unit for illuminating the mask to be characterized with light from the light source;

a sensor unit;

an evaluation unit for evaluating the light that passes in a used beam path from the light source via the mask to the sensor unit;

a mirror array composed of a multitude of independently adjustable mirror elements via which at least a portion of the light can be outcoupled from the used beam path; and an intensity sensor for detecting the intensity of a light component outcoupled from the used beam path by the mirror array.

In one embodiment, the apparatus is configured to conduct a method having the features described above.

With regard to advantages and preferred configurations of the device, reference is made to the above explanations in association with the method according to the invention.

Further configurations of the invention can be gathered from the description and the dependent claims.

The invention is explained in greater detail below on the basis of exemplary embodiments illustrated in the accompanying figures.

DETAILED DESCRIPTION

Figure 8:
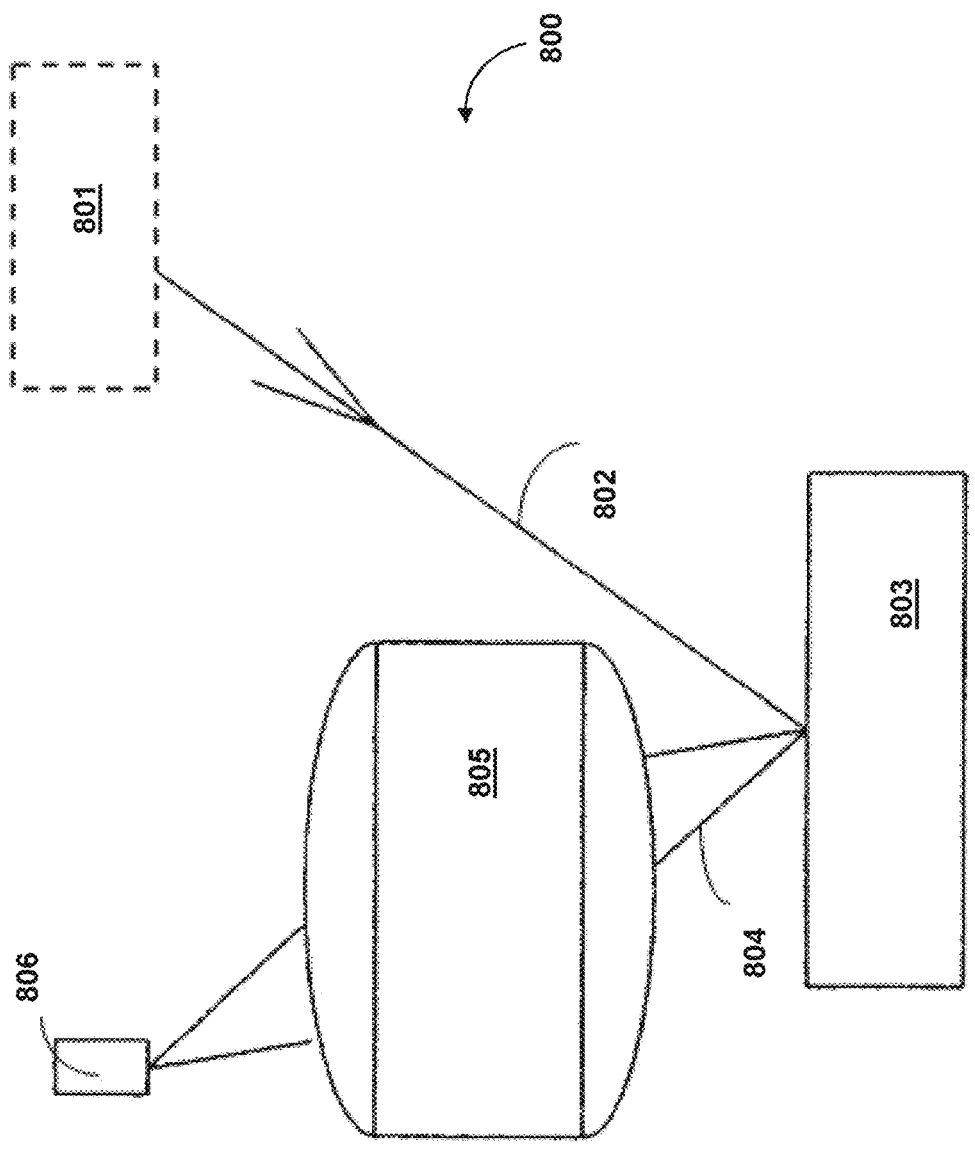
FIG. 8 a schematic diagram for elucidation of the general construction of an apparatus for characterization of a mask.

In a general construction according to FIG. 8, a mask inspection system 800 comprises an illumination system 801 and a projection lens 805, wherein light from a light source (not shown in FIG. 1) enters the illumination system 801 and a pencil of illumination rays 802 is directed to a mask 803 arranged in the object plane of the projection lens 805, and wherein the illuminated region of the mask 803 is imaged by use of a pencil of observation rays 804 onto a sensor arrangement 806, e.g. a CCD camera, by use of the projection lens 805.

In order to have, in the mask inspection, maximum quality of reproducibility of the illumination conditions that are encountered by the projection illumination system or the scanner in the actual lithography process, it is important also to emulate the illumination settings used in the production illumination system or lighting device thereof in conjunction with the mask 803, i.e. including partial coherence of the illumination light hitting the mask 803 that may be associated with the illumination setting, for which it is customary in turn to use corresponding shutters (i.e., for instance, in the case of a quadrupole setting used in the later lithography process, a quadrupole shutter with four cutouts adapted to the illumination poles) in the illumination system of the mask inspection system 800, by means of which it is possible to implement partial coherent illumination in the mask inspection system. In addition, in the projection lens 805 of the mask inspection system 800, it is possible to simulate the limitation of the beam pathway, i.e. the NA, likewise through use of a suitable mask (typically with a corresponding circular or elliptical cutout).

Different embodiments of an apparatus of an invention for characterization of a mask with reference to the schematic diagrams of FIGS. 1A-7D are described hereinafter.

What is common to these embodiments is that, in the respective apparatus operated with light from an EUV light source (i.e. light of a wavelength of less than 30 nm, especially less than 15 nm), a mirror array composed of a multitude of independently adjustable mirror elements is used in order to intermittently outcouple light for implementation of different functionalities from the used beam path that leads from the light source through the mask to the sensor arrangement. The mirror elements of the mirror array each have a coating suitable for the working wavelength of the light source (for example about 13.5 nm), for example a molybdenum (Mo)-silicon (Si) reflection layer stack.

Figure 1A:
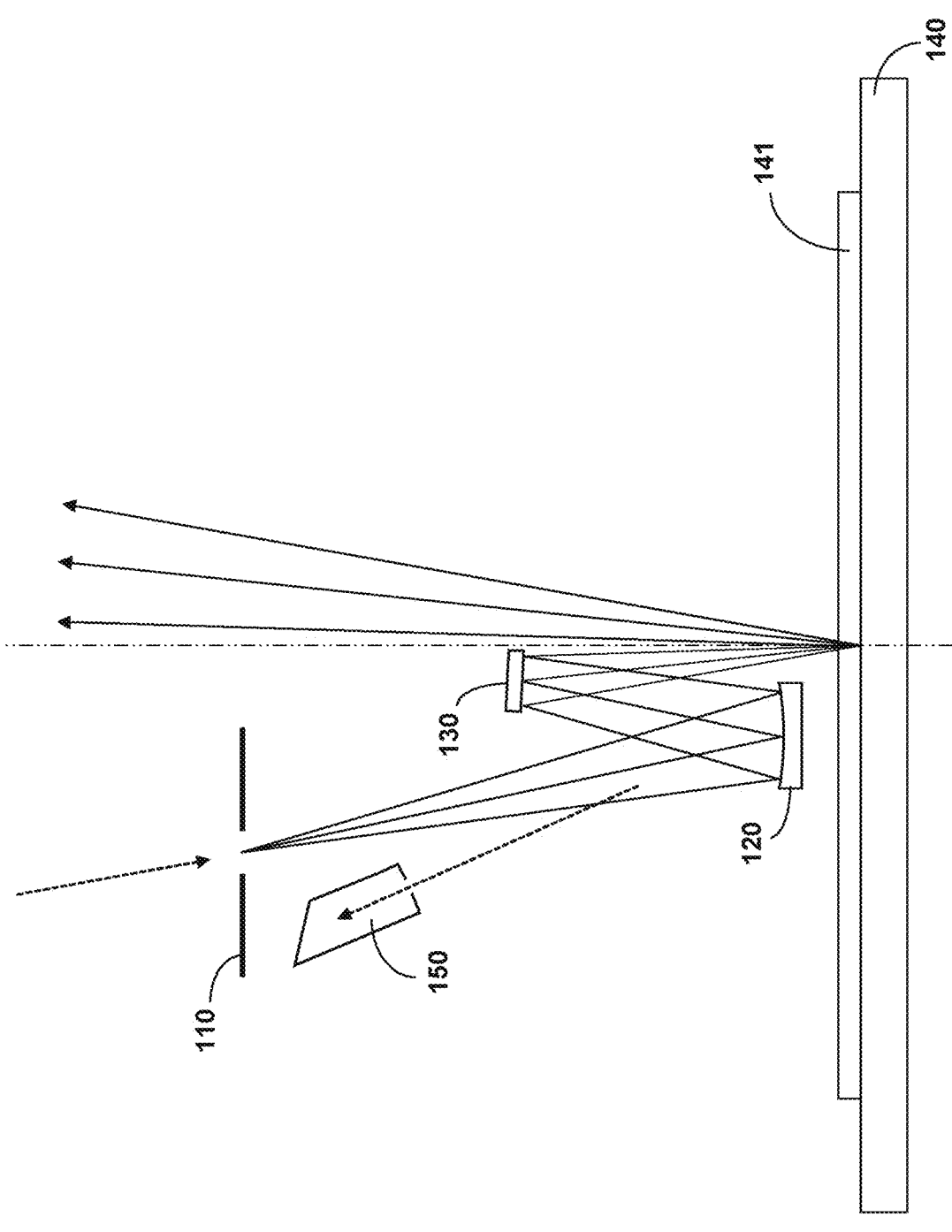
FIGS. 1A-IC schematic diagrams for elucidation of the possible construction and the manner of function of an apparatus of the invention for characterization of a mask in a first embodiment.

With reference firstly to FIG. 1A, said EUV light from the light source (not shown in FIG. 1A) passes through a shutter 110 via a mirror 120 to such a mirror array 130, whence the EUV light, according to the setting of the respective mirror elements, can be directed through the mask 140 to the sensor arrangement (likewise not shown in FIG. 1A) or else outcoupled from the used beam path. As merely indicated in FIG. 1A, the light component outcoupled from said used beam path is directed here into a beam trap identified by "150".

In a first functionality implementable with the construction of FIG. 1A, it is then possible, by use of suitable actuation of the mirror elements of the mirror array 130, to establish a defined illumination time of the sensor unit, namely by outcoupling all the light from the used beam path at the respectively suitable junctures via the mirror array 130. This especially takes account of the fact that the EUV light source as such does not enable repeated switch-on and switch-off on a short timescale. At the same time, said actuation of the mirror elements of the mirror array 130 makes it unnecessary to use a high-speed shutter.

Figure 1B:
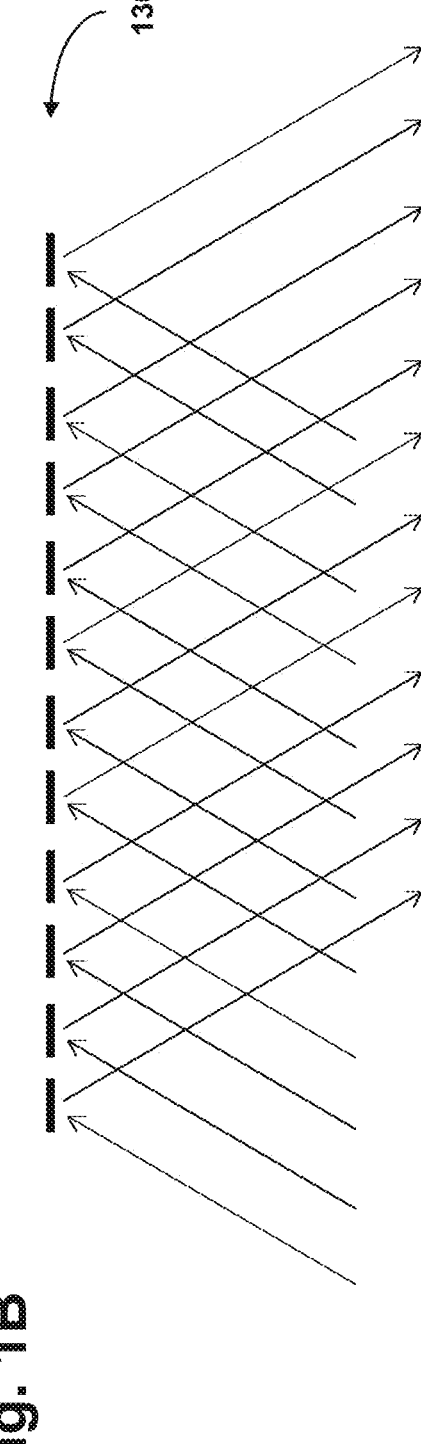
Figure 1C:
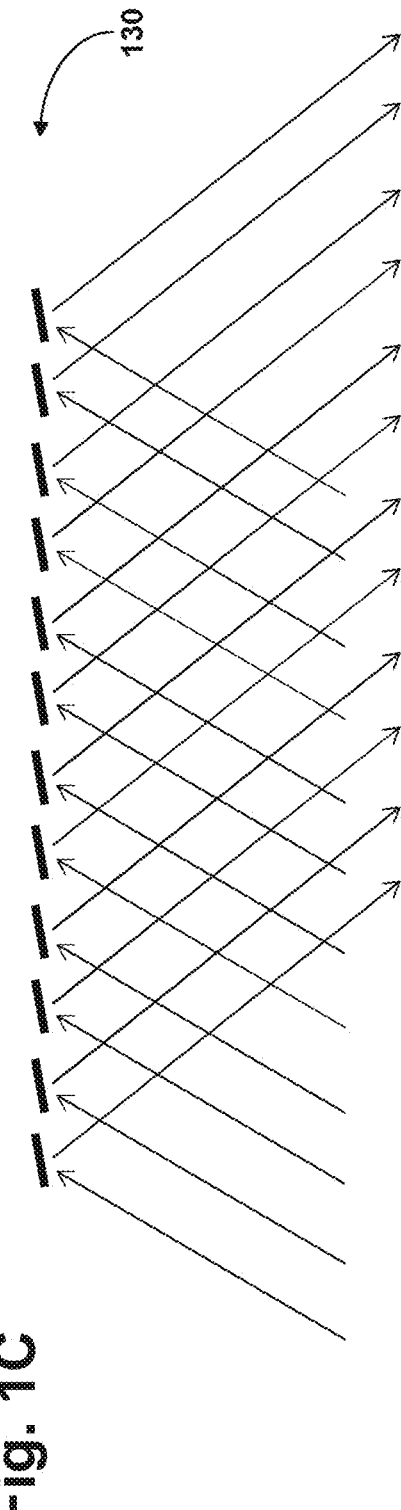

FIGS. 1B and 1C show schematic diagrams for illustration of the above-described functionality of the mirror array 130.

According to FIG. 1C, before commencement and after the end of the respectively desired exposure time, all mirror elements of the mirror array 130 are tilted with respect to the rest position and reflect incident illuminating light from the light source in the direction of the beam trap 150. In a further possible configuration according to FIG. 1B, from the start to the end of the respectively desired illumination time, all mirror elements of the mirror array 130 are in rest position and reflect the incident illuminating light from the light source in the direction of the photomask.

If combination of this functionality with the functionality for forming a particular illumination setting is desired, from the start to the end of the respectively desired illumination time, the mirror elements in rest position are solely those at positions where the desired illumination setting is bright. All other mirror elements, before, during and after the desired exposure time, are tilted such that they direct the light in the direction of the beam trap 150.

Figure 2:
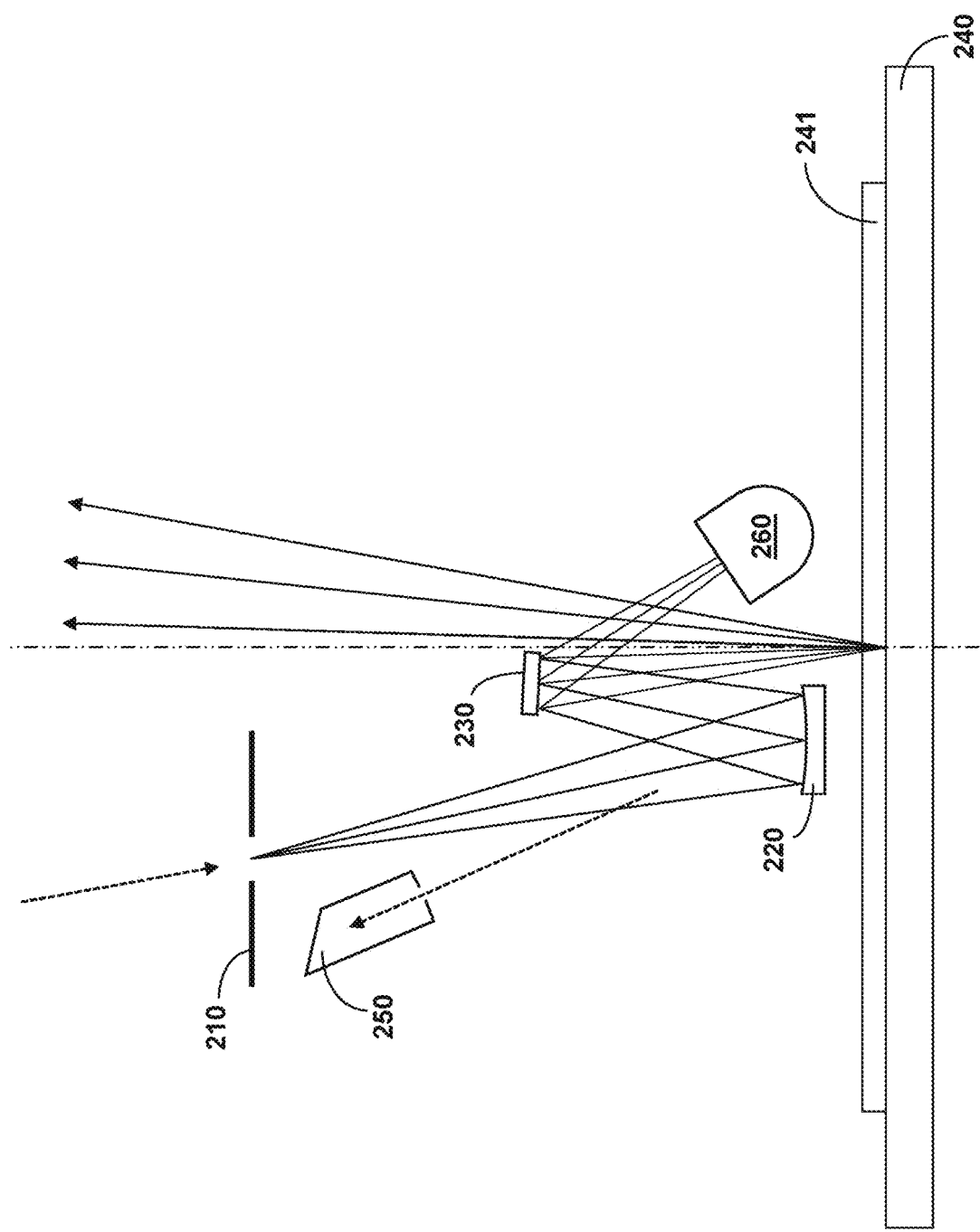
FIG. 2 a schematic diagram for elucidation of the possible construction of an apparatus of the invention in a further embodiment.

FIG. 2 shows a schematic diagram for elucidation of a further embodiment of an apparatus of the invention for characterizing a mask, wherein components that are analogous or substantially functionally identical in comparison with FIG. 1A are designated by reference numerals increased by "100".

According to FIG. 2, the apparatus additionally has an intensity sensor 260 via which the intensity of a light component outcoupled from the mirror array 230 can be detected. Via the use of the intensity sensor 260 in combination with the mirror array 230, the invention enables ascertainment of energy fluctuations on the part of the light source such that the images recorded by the sensor unit can be normalized to the energy of the light source. In particular, for instance in the event of occurrence of fluctuations in brightness, a distinction can be made as to whether such fluctuations in brightness in the images recorded by the sensor unit are caused by the mask 240 currently being characterized (for example by any defects present in this mask 240) or by fluctuations in energy of the light source, such that incorrect conclusions as to defects perceived to be present on the mask may be avoided.

Figure 4:
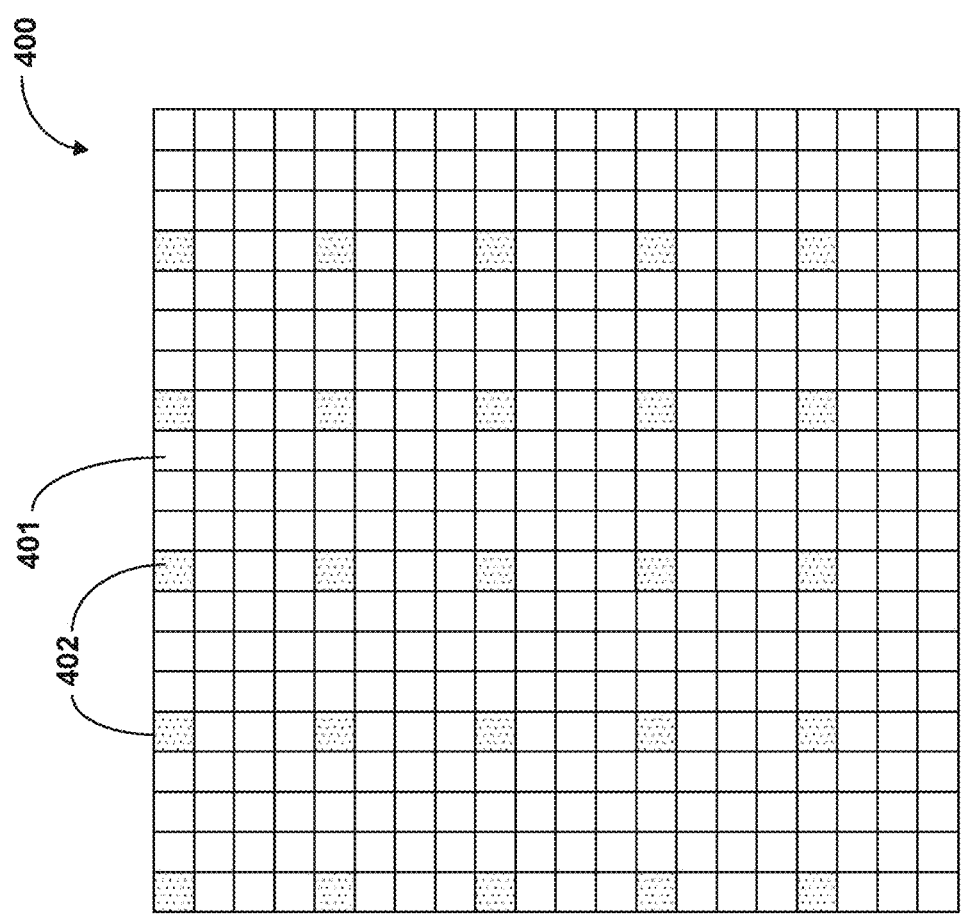
FIGS. 4-5 schematic diagrams for elucidation of the possible manner of function of an apparatus of the invention.

The outcoupling of a comparatively small light component is sufficient here for said normalization, such that by far the predominant light component is still available for the actual mask characterization. FIG. 4 shows an illustrative implementation, wherein, of the mirror elements of a mirror arrangement 400, the mirror elements shown in hatched form (of which, by way of example, two are identified as "402") direct incident light to the intensity sensor, whereas the light from the other mirror elements (of which, by way of example, one is identified as "401") hits the mask.

The outcoupling of light described above with reference to FIG. 2 and FIG. 4, by comparison with a detection of the intensity outside the illuminated mask region which is likewise possible in principle, has the advantage of elevated measurement accuracy since the light outcoupled in the direction of the intensity sensor for the purpose of normalization is outcoupled directly from the pupil and not from a region outside it.

Figure 5:
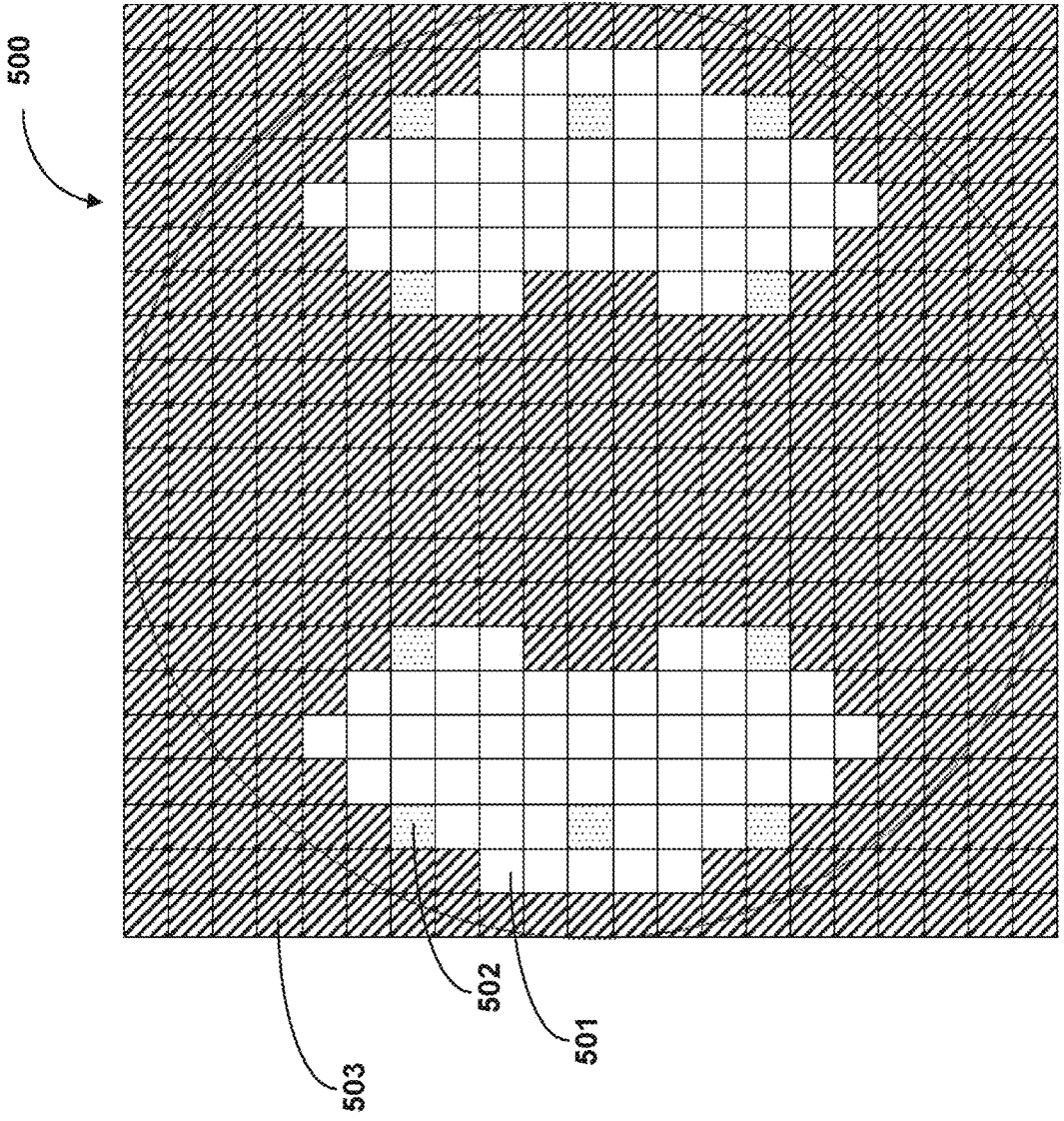

FIG. 5 shows a schematic diagram analogous to FIG. 4 for illustration of a further possible scenario, wherein mirror elements not shown in hatched or dotted form (of which, by way of example, one is identified as "501") direct the respectively incident light in the direction of the mask, with the mirror elements shown in dotted form (of which, by way of example, one is identified as "502") directing the respectively incident light in the direction of the intensity sensor for the purpose of the above-described normalization, and with the mirror elements shown in hatched form (of which, by way of example, one is identified as "503") directing incident light in the direction of the beam trap. As a result, in this way, a desired illumination setting (a dipole illumination in the specific working example) is achieved.

Figure 3:
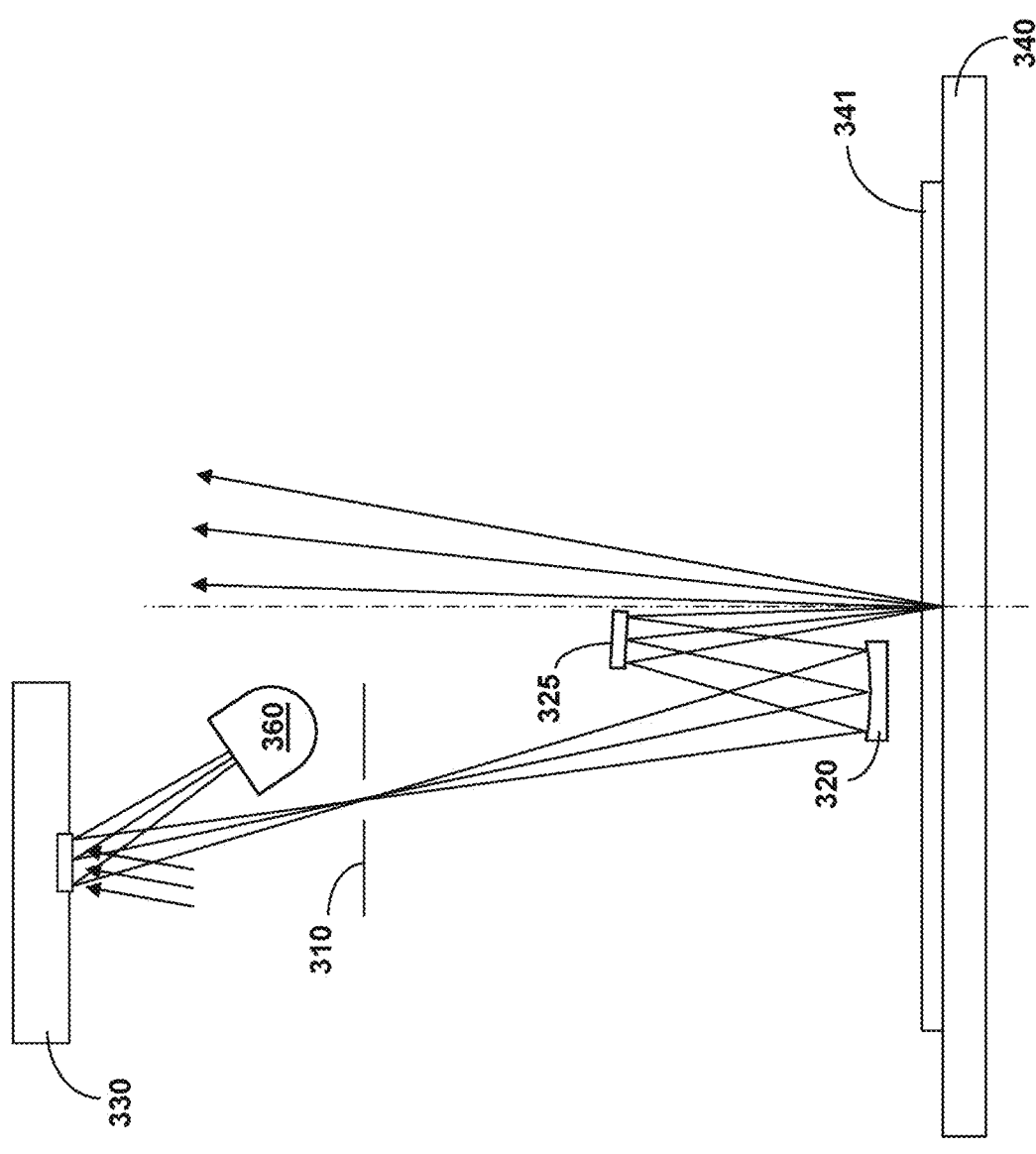
FIG. 3 a schematic diagram for elucidation of the possible construction of an apparatus of the invention in a further embodiment.

FIG. 3 shows a schematic diagram for elucidation of a further embodiment of an apparatus of the invention for characterizing a mask, wherein components that are analogous or substantially functionally identical in comparison with FIG. 2 are designated by reference numerals increased by "100".

The embodiment according to FIG. 3 differs from that from FIG. 2 in particular in the different positioning of the mirror array 330 based on the optical beam path. Specifically, the mirror array 330, based on the optical path, is arranged upstream of the mirror 320 and upstream of the shutter 310, for the purpose of which a further mirror 325 is provided after the mirror 320 in the continuation of the beam path. The arrangement of the mirror array 330 according to FIG. 3 is advantageous firstly in that a restriction of the available light path between mask 340 and imaging optics or sensor unit by the mirror array 330 is avoided, and there is also an increase in the construction space available for cooling of the mirror array 330 (for example via cooling fluid connections) and for electronic and actuation components as a result of the positioning of the mirror array 330 at a greater distance from the mask 340.

In embodiments of the invention, additionally or alternatively to the functionalities described above with reference to FIG. 1A to FIG. 5, it is also possible to implement greyscale settings via the mirror array according to the invention. For this purpose, some of the mirror elements of the mirror array of the invention in each case may be actuated such that they outcouple light from the used beam path only for some of the period of illumination of the sensor unit or CCD camera. This takes account of the fact that, in the inventive configuration of a mask inspection system for operation with EUV light, unlike in DUV systems, no angle-dependent adjustment of greyscale values is possible via variation of diffraction efficiency, since, on account of the shorter wavelength by a number of orders of magnitude compared to the dimensions and separations of the mirror elements, it is necessary to proceed from geometric optics in the case of operation with EUV light. Instead, the invention includes, for implementation of greyscale values, the principle of establishing different greyscale values over the duration of the respective tilting of the mirror elements (or the ratio between this duration and the overall illumination time).

Merely by way of example, for implementation of greyscale values, some of the mirror elements, even after a portion of the respective illumination time (for example after a period of time of 50 ms and hence a quarter of the total illumination time of, for example, 200 ms), are tilted into the position suitable for outcoupling of the light from the used beam path.

FIGS. 6A-7D show schematic diagrams for elucidation of further embodiments of an apparatus according to the invention for characterization of a mask. In this case (additionally or alternatively to the above-described functionalities), the further functionality of a beam divider for separation of the imaging beam path from the illumination beam path is especially implemented for enabling a mask inspection with perpendicular incidence of light.

This takes account of the fact that, in the inventive operation of a mask inspection system with EUV light, for lack of available transmissive materials, there is no transmissive optical element directly available as beam divider. In this respect, the invention includes the further principle of ensuring, by suitable adjustment of the mirror elements of the mirror array, that the mirror array can ultimately contribute to the illumination beam path and to the imaging beam path.

Figures 6A, 6B:
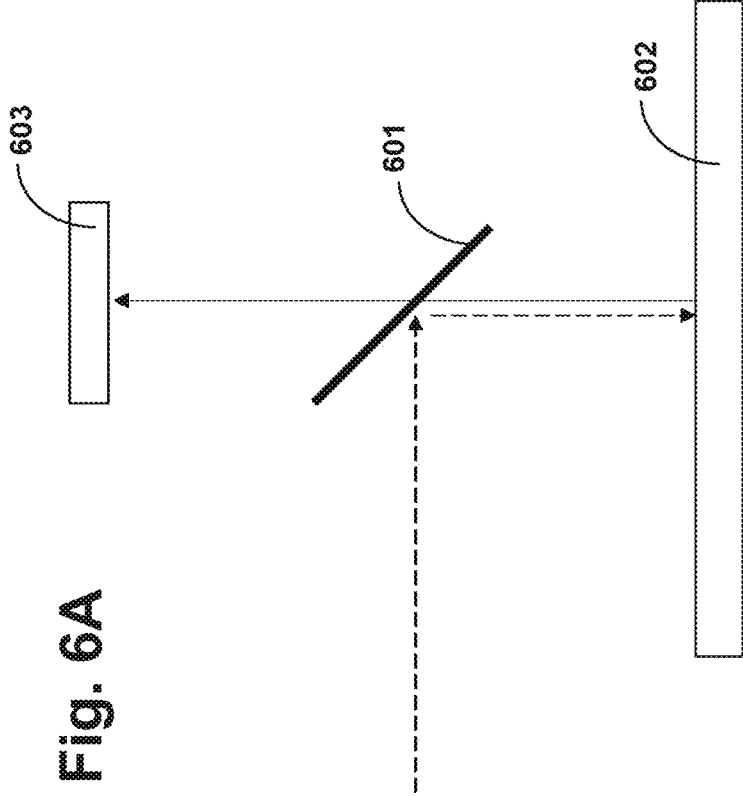
FIGS. 6A-6B schematic diagrams for elucidation of the possible construction of an apparatus of the invention in a further embodiment.

FIGS. 6A-6B firstly show schematic diagrams for illustration of the underlying principle, wherein according to FIG. 6A, in principle, a beam divider 601 for vertical illumination of a mask 602 and enabling of imaging to give a sensor unit 603 is required. FIG. 6B illustrates the implementation in principle of an inventive mirror array 630, with "611," indicating the illuminating light incident on the mirror array 630 and "614" the light directed by the mirror array 630 to the imaging optics. "615" indicates a light component outcoupled analogously to the above-described embodiments in the direction of an additional intensity sensor.

Figure 7A:
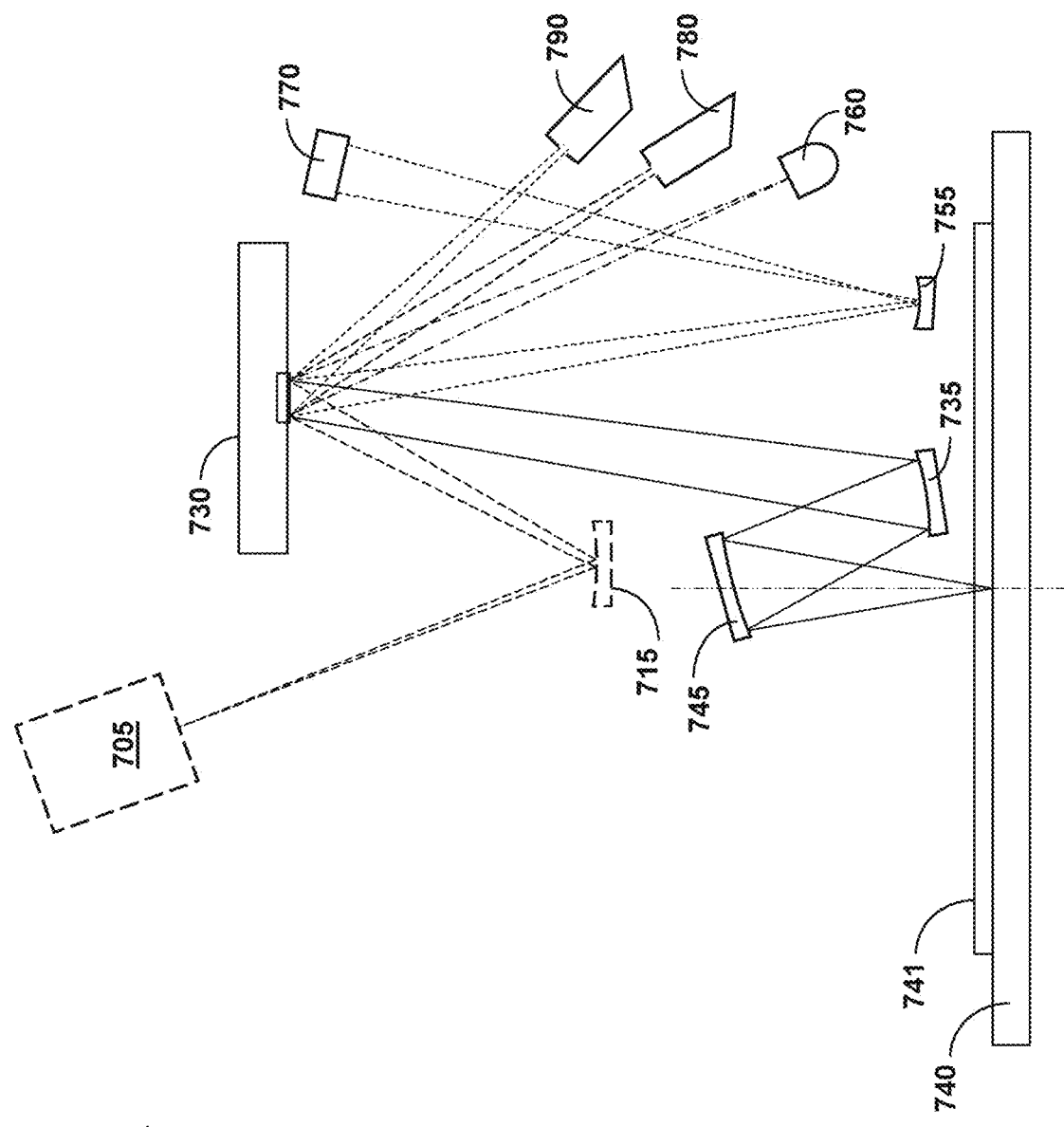
FIGS. 7A-7D schematic diagrams for elucidation of construction and possible mode of function of an apparatus of the invention in a further embodiment.

FIG. 7A shows a schematic diagram of the possible construction of a corresponding apparatus according to the invention, in which all of the above-described functionalities (i.e. the implementation of a high-speed shutter, the outcoupling of a light component in the direction of an intensity sensor for normalization or calibration purposes, the establishment of greyscale values and the separation of illumination beam path and imaging beam path for the purpose of characterization of the mask with perpendicular incidence of light) are implemented. Components analogous or substantially functionally identical in comparison with FIG. 3 are denoted here by reference numerals increased by "400". FIG. 7A additionally shows the position of an (EUV) light source 705 and of a sensor unit 770 (configured, for example, as a CCD camera). "715", "735", "745" and "755" each indicate mirrors that are present for implementation of the beam path and are curved in the working example. "780" indicates a beam trap for receiving light which is reflected by mirror elements of the mirror array 730 in the respective rest position. "790" indicates a light trap for trapping imaging light which is reflected by mirror elements and is used for outcoupling of a light component in the direction of the intensity sensor 760.

Figure 7B:
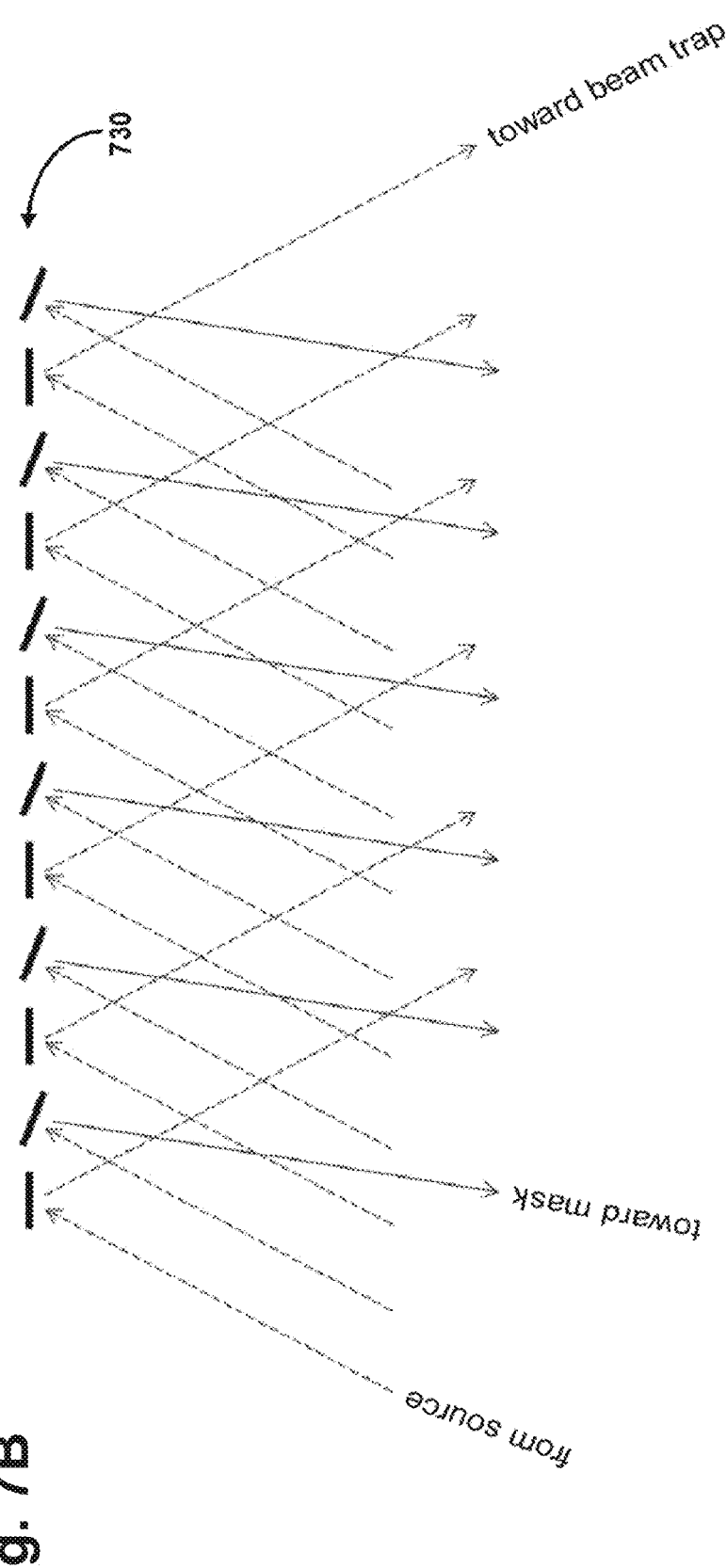
Figure 7C:
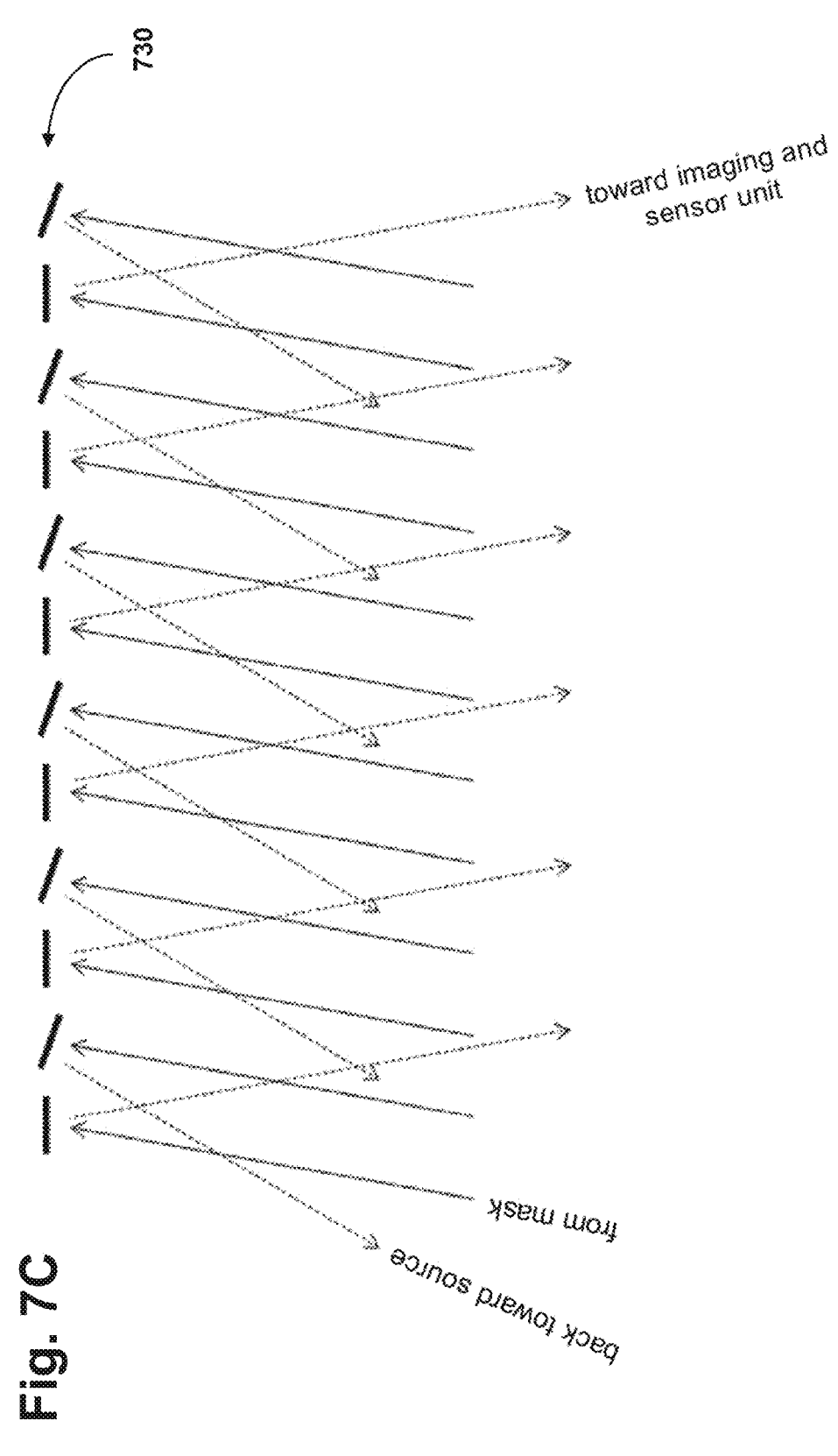

FIG. 7B shows, with reference to an enlarged detail of the mirror array 730, a scenario that occurs in operation of the apparatus when light in each case hits the mirror array 730 for the first time. As indicated in FIG. 7B, for example, half of the mirror elements are in rest position, such that they reflect the incident illuminating light in the direction of the beam trap 780. The other mirror elements of the mirror array 730, by contrast, are deflected in such a way that they reflect the incident illuminating light in the direction of the mask 740. FIG. 7C shows a further scenario that occurs in the operation of the apparatus when light hits the mirror array 730 for a second time. Here, the mirror elements in the rest position reflect the light coming from the mask 740 in the direction of the sensor unit 770 or CCD camera, whereas the other, deflected mirror elements reflect the light incident on the mask back to the light source 705.

Figure 7D:
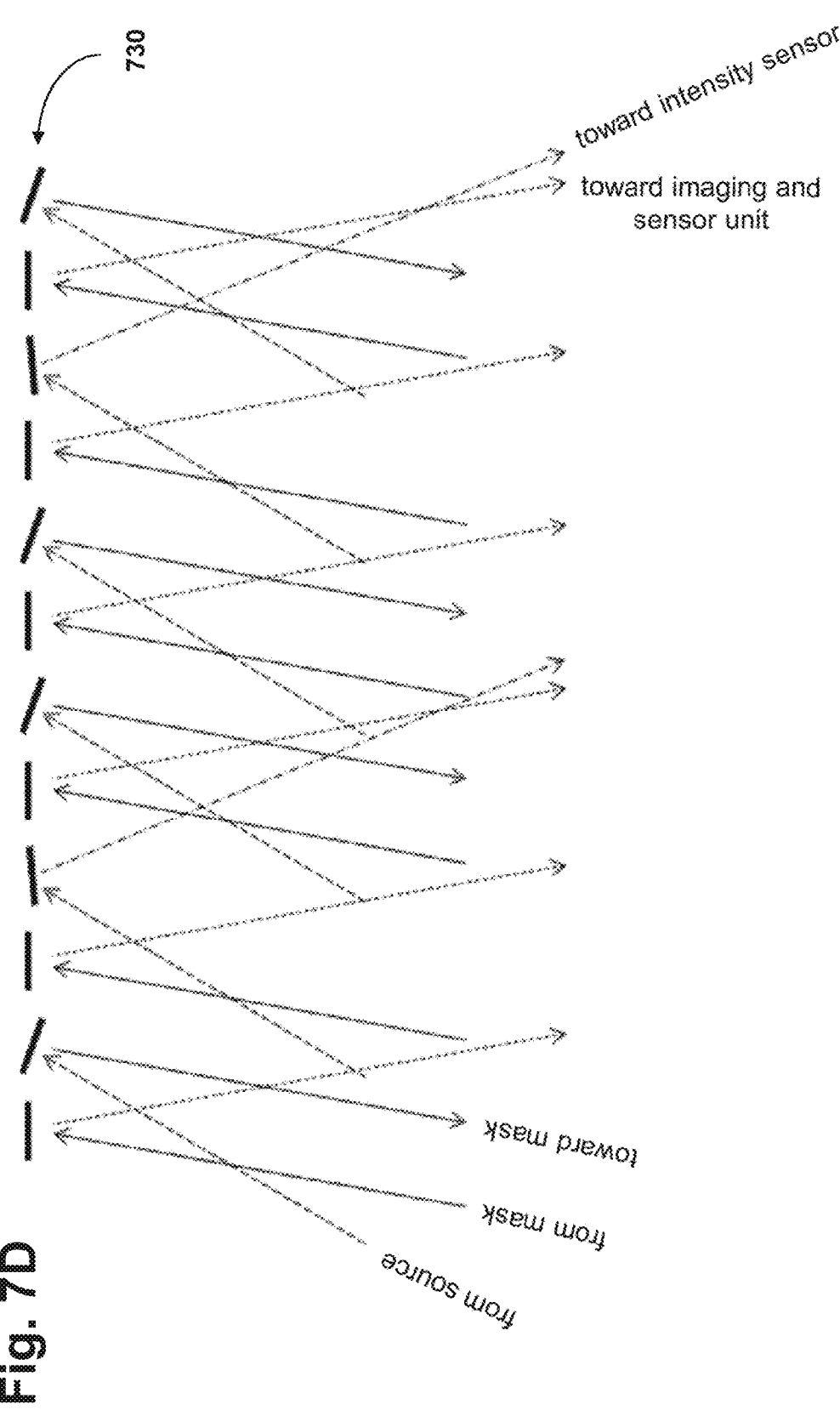

FIG. 7D shows a further scenario in the operation of the apparatus, wherein two mirror elements of the mirror array 730 are tilted here such that they direct incident illuminating light in the direction of the intensity sensor 760.

Even though the invention has been described on the basis of specific embodiments, numerous variations and alternative embodiments will be apparent to a person skilled in the art, for example through combination and/or exchange of features of individual embodiments. Accordingly, it will be apparent to a person skilled in the art that such variations and alternative embodiments are also encompassed by the present invention, and the scope of the invention is restricted only within the scope of the appended patent claims and the equivalents thereof.

What is claimed is:

1. A method of characterizing a microlithography mask, wherein the mask to be characterized is illuminated with light from a light source via an illumination optics unit, said light having a wavelength of less than 30 nm; and wherein light that passes in a used beam path from the light source via the mask to a sensor unit is evaluated; wherein, at least intermittently, a portion of the light emitted by the light source is outcoupled from the used beam path by use of a mirror array having a multitude of independently adjustable mirror elements; and wherein, intermittently by use of the mirror array, all light is outcoupled from the used beam path for establishment of a defined illumination time of the sensor unit; wherein, in an intermittent manner, the settings of the mirror elements are chosen such that a first group of mirror elements is in an illumination beam path leading from the light source to the mask, and a second group of mirror elements is in an imaging beam path leading from the mask to the sensor unit.

2. The method of claim 1, wherein the outcoupled light is directed at least partly to a beam trap.

3. The method of claim 1, wherein, at least intermittently, the intensity of a light component outcoupled from the used beam path by the mirror array is detected with an intensity sensor.

4. A method of characterizing a microlithography mask, wherein the mask to be characterized is illuminated with light from a light source via an illumination optics unit, said light having a wavelength of less than 30 nm; and wherein light that passes in a used beam path from the light source via the mask to a sensor unit is evaluated; wherein, at least intermittently, a portion of the light emitted by the light source is outcoupled from the used beam path by use of a mirror array having a multitude of independently adjustable mirror elements; and wherein, at least intermittently, the intensity of a light component outcoupled from the used beam path by the mirror array is detected with an intensity sensor that is different from the sensor unit.

5. The method of claim 4, wherein greyscale adjustment is achieved by actuating at least some of the mirror elements in such a way that they outcouple light from the used beam path only for some of the period of illumination of the sensor unit.

6. A method of characterizing a microlithography mask, wherein the mask to be characterized is illuminated with light from a light source via an illumination optics unit, said light having a wavelength of less than 30 nm; and wherein light that passes in a used beam path from the light source via the mask to a sensor unit is evaluated;

wherein, at least intermittently, a portion of the light emitted by the light source is outcoupled from the used beam path by use of a mirror array having a multitude of independently adjustable mirror elements; and wherein greyscale adjustment is achieved by actuating at least some of the mirror elements in such a way that they outcouple light from the used beam path only for some of the period of illumination of the sensor unit;

wherein, in an intermittent manner, the settings of the mirror elements are chosen such that a first group of mirror elements is in an illumination beam path leading from the light source to the mask, and a second group of mirror elements is in an imaging beam path leading from the mask to the sensor unit.

7. The method of claim 6, wherein, in an intermittent manner, the settings of the mirror elements are chosen such that light hits the mask at an angle of at least 85° based on the mask surface.

8. The method of claim 6, wherein the light from the light source has a wavelength of less than 15 nm.

9. An apparatus for characterizing a microlithography mask, comprising a light source for generating light of a wavelength of less than 30 nm;

an illumination optics unit for illuminating the mask to be characterized with light from the light source;

a sensor unit;

an evaluation unit for evaluating the light that passes in a used beam path from the light source via the mask to the sensor unit;

a mirror array composed of a multitude of independently adjustable mirror elements via which at least a portion of the light can be outcoupled from the used beam path; and an actuating unit for actuating the mirror array;

wherein use of this actuation for establishment of a defined illumination time of the sensor unit, it is possible to intermittently outcouple all light from the used beam path by use of the mirror array;

wherein the actuating unit is configured such that, in an intermittent manner, the settings of the mirror elements are chosen such that a first group of mirror elements is in an illumination beam path leading from the light source to the mask, and a second group of mirror elements is in an imaging beam path leading from the mask to the sensor unit.

10. The apparatus of claim 9, comprising a beam trap for receiving a light component outcoupled from the used beam path by the mirror array.

11. The apparatus of claim 9, comprising an intensity sensor for detecting the intensity of a light component outcoupled from the used beam path by the mirror array.

12. An apparatus for characterizing a microlithography mask, comprising a light source for generating light of a wavelength of less than 30 nm;

an illumination optics unit for illuminating the mask to be characterized with light from the light source;

a sensor unit;

an evaluation unit for evaluating the light that passes in a used beam path from the light source via the mask to the sensor unit;

a mirror array composed of a multitude of independently adjustable mirror elements via which at least a portion of the light can be outcoupled from the used beam path; and an intensity sensor for detecting the intensity of a light component outcoupled from the used beam path by the mirror array, wherein the intensity sensor is different from the sensor unit.

13. The apparatus of claim 9, wherein the light from the light source has a wavelength of less than 15 nm.

14. The apparatus of claim 9, wherein the apparatus is configured to implement a method comprising:

illuminating the mask to be characterized with the light from the light source via the illumination optics unit;

evaluating light that passes in the used beam path from the light source via the mask to the sensor unit;

outcoupling, at least intermittently, a portion of the light emitted by the light source from the used beam path by use of the mirror array; and coupling, intermittently by use of the mirror array, all light from the used beam path for establishment of a defined illumination time of the sensor unit.

15. The apparatus of claim 14, comprising a beam trap configured to receive at least a portion of the outcoupled light.

16. The apparatus according of claim 12 wherein the apparatus is configured to implement a method comprising:

illuminating the mask to be characterized with the light from the light source via the illumination optics unit;

evaluating light that passes in the used beam path from the light source via the mask to the sensor unit;

outcoupling, at least intermittently, a portion of the light emitted by the light source from the used beam path by use of the mirror array; and coupling, intermittently by use of the mirror array, all light from the used beam path for establishment of a defined illumination time of the sensor unit.

17. The apparatus of claim 16, comprising a beam trap configured to receive at least a portion of the outcoupled light.

18. The method of claim 1 wherein greyscale adjustment is achieved by actuating at least some of the mirror elements in such a way that they outcouple light from the used beam path only for some of the period of illumination of the sensor unit.

* * * * *